United States Patent
Zheng

(10) Patent No.: US 9,419,618 B1
(45) Date of Patent: Aug. 16, 2016

(54) INTERFACE CIRCUIT AND ELECTRONIC SYSTEM USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Sheng-Cun Zheng, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/811,476

(22) Filed: Jul. 28, 2015

(30) Foreign Application Priority Data

May 28, 2015 (CN) .......................... 2015 1 0279125

(51) Int. Cl.
*H03L 5/00* (2006.01)
*H03K 19/0185* (2006.01)

(52) U.S. Cl.
CPC ................ *H03K 19/01855* (2013.01)

(58) Field of Classification Search
None
See application file for complete search history.

(56) References Cited

U.S. PATENT DOCUMENTS

| 7,184,361 | B2* | 2/2007 | Lee | G06F 13/4291 327/333 |
|---|---|---|---|---|
| 7,230,454 | B2* | 6/2007 | Welser | H03F 3/2175 326/83 |
| 2006/0132215 | A1* | 6/2006 | Chang | H03K 19/018592 327/333 |
| 2009/0243695 | A1* | 10/2009 | Thoma | H03K 19/018592 327/333 |
| 2009/0267672 | A1* | 10/2009 | Liao | G06F 13/4282 327/202 |
| 2010/0007377 | A1* | 1/2010 | Hing | G11C 7/1045 326/38 |
| 2011/0102053 | A1* | 5/2011 | Wang | G01R 31/3172 327/365 |
| 2015/0061734 | A1* | 3/2015 | Ogawa | H03K 19/018521 327/143 |
| 2015/0295563 | A1* | 10/2015 | Kim | H03K 3/013 327/543 |

* cited by examiner

*Primary Examiner* — Lincoln Donovan
*Assistant Examiner* — Khareem E Almo
(74) *Attorney, Agent, or Firm* — ScienBiziP, P.C.

(57) ABSTRACT

An interface circuit applied in an electronic system includes a first control circuit and a second control circuit. The first control circuit includes a first control chip, a first voltage division unit, a switch unit, and a first connector. The second control circuit includes a second control chip, a second voltage division unit, a third voltage division unit, and a second connector. When the serial data pin or the serial clock pin first control chip outputs a first voltage level signal, the serial data pin or the serial clock pin second control chip receives the first voltage level signal. When the serial data pin or the serial clock pin first control chip outputs a second voltage level signal, the serial data pin or the serial clock pin second control chip receives a second voltage level signal from a power source terminal.

14 Claims, 4 Drawing Sheets

INTERFACE CIRCUIT AND ELECTRONIC SYSTEM USING THE SAME

FIELD

The subject matter herein generally relates to electronic systems and particularly to an electronic device with an interface circuit.

BACKGROUND

An inter-integrated circuit (I2C) interface on a motherboard of a server is usually coupled to an I2C interface on a system board, to transmit signal. However, if the I2C interface on the motherboard is coupled to a plurality of I2C interfaces with different voltage levels on different system boards, the motherboard can not transmit signal with each system board.

BRIEF DESCRIPTION OF THE DRAWINGS

Implementations of the present technology will now be described, by way of example only, with reference to the attached figures.

DETAILED DESCRIPTION

Figure 1:
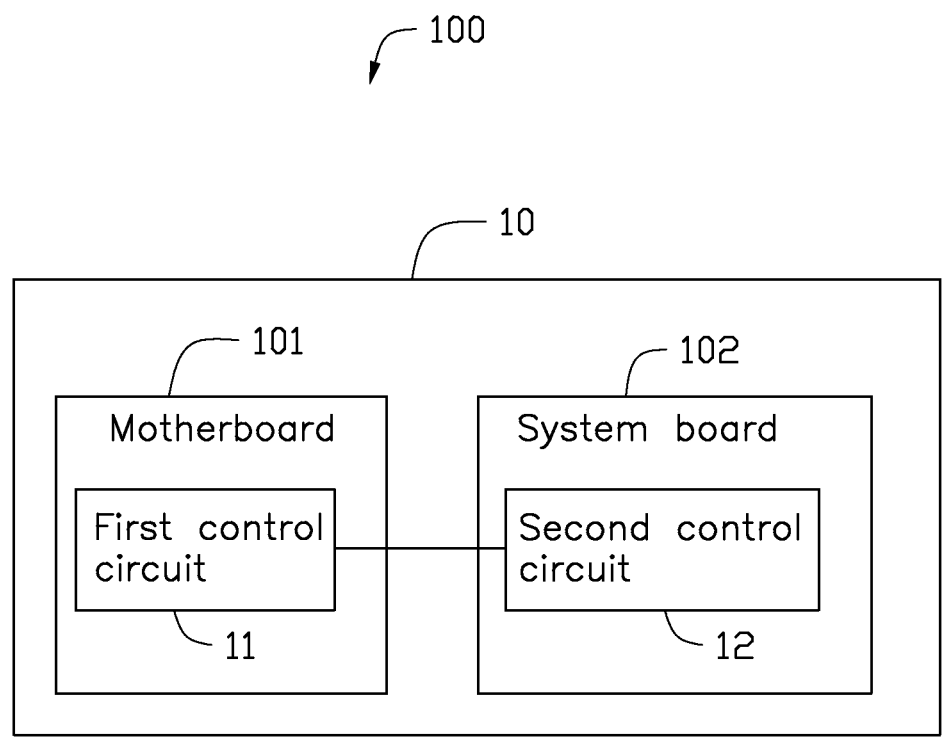
FIG. 1 is a block diagram of an example embodiment of an electronic system, the electronic system comprising an interface circuit comprising a first control circuit and second control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to an interface circuit.

FIG. 1 illustrates block diagram of an example embodiment of an electronic system 100. The electronic system 100 can comprise an interface circuit 10. The interface circuit 10 can comprise a motherboard 101 and a system board 102. The motherboard 101 can comprise a first control circuit 11. The system board 102 can comprise a second control circuit 12.

Figure 2:
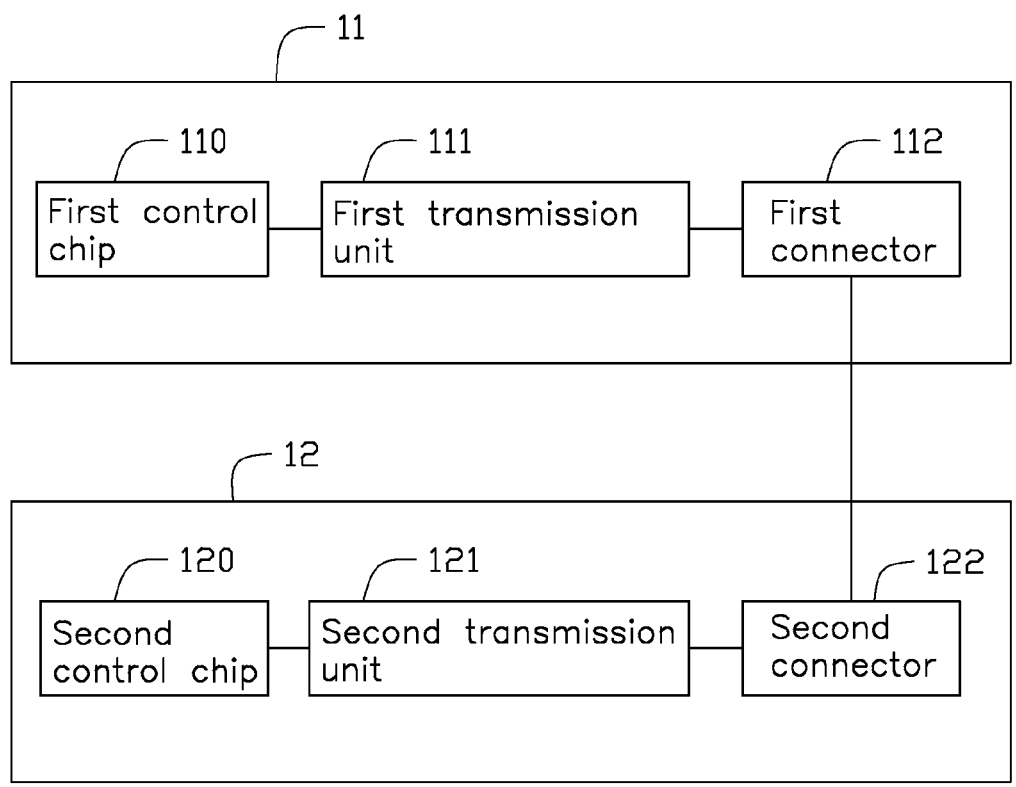
FIG. 2 is a block diagram of an example embodiment of the first control circuit coupled to the second control circuit of FIG. 1

FIG. 2 illustrates a block diagram of an example embodiment of the first control circuit 11 electrically coupled to the second control circuit 12 of the interface circuit 10. The first control circuit 11 can comprise a first control chip 110, a first transmission unit 111 electrically coupled to the first control chip 110, and a first connector 112 electrically coupled to the first transmission unit 111. The second control circuit 12 can comprise a second control chip 120, a second transmission unit 121 electrically coupled to the second control chip 120, and a second connector 122 electrically coupled to the second transmission unit 121. Both of the first control chip 110 and the second control chip 120 are inter-integrated circuit (I2C) control chip. In at least one embodiment, the first connector 112 of the first control circuit 11 is electrically coupled to the second connector 122 of the second control circuit 12, to transmit data. Both of the first connector 112 and the second connector 122 are I2C connectors.

Figure 3:
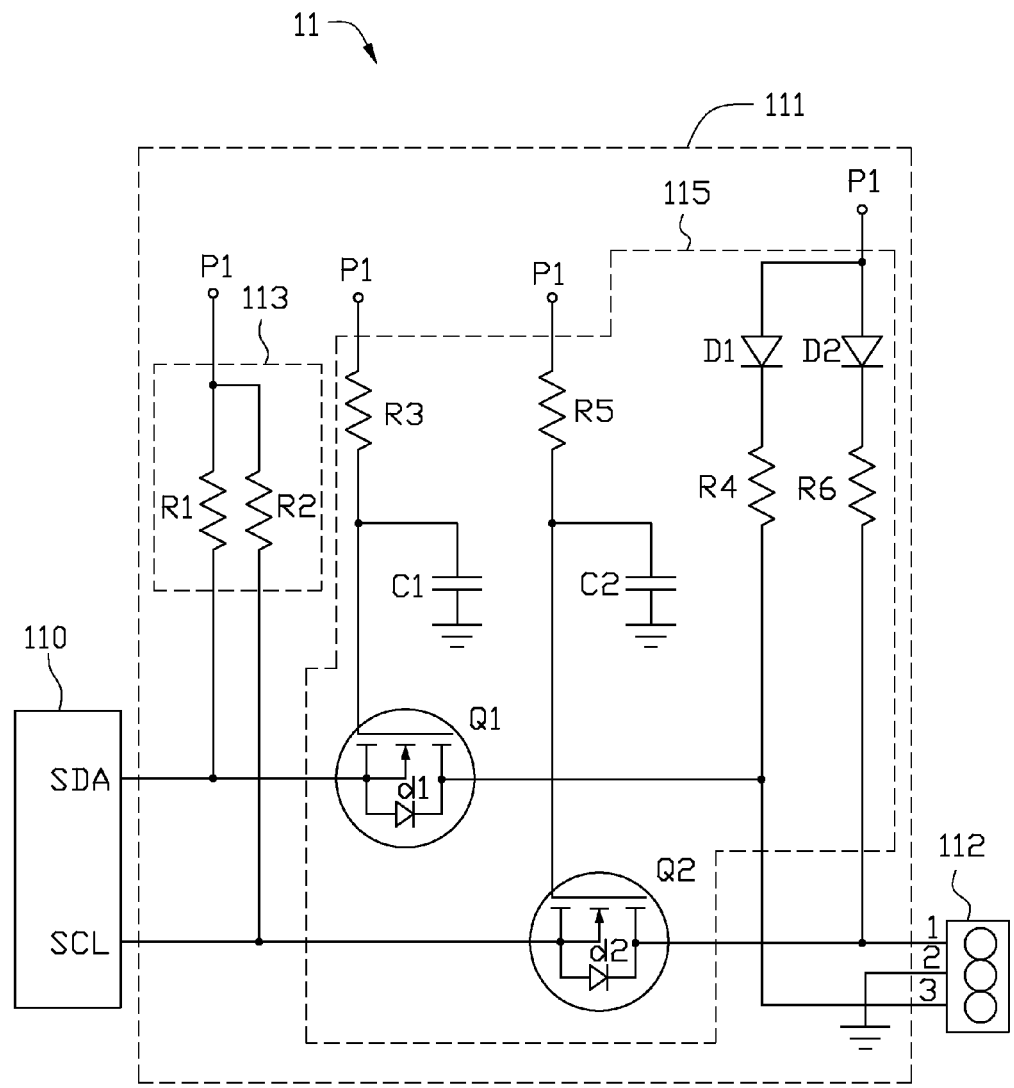
FIG. 3 is a circuit diagram of an example embodiment of the first control circuit of FIG. 2.

FIG. 3 is a circuit diagram of an example embodiment of the first control circuit 11. The first transmission unit 111 of the first control circuit 11 can comprise a first voltage division unit 113 and a switch unit 115. The first voltage division unit 113 can comprise two resistors R1 and R2. The switch unit 115 can comprise two electronic switches Q1 and Q2, four resistors R3, R4, R5, R6, two capacitors C1, C2, and two diodes D1, D2. A serial data pin SDA of the first control chip 110 is electrically coupled to a first power source terminal P1 through the resistor R1. A serial clock pin SCL of the first control chip 110 is electrically coupled to the first power source terminal P1 through the resistor R2. A first terminal of the electronic switch Q1 is electrically coupled to the first power terminal P1 through the resistor R3, and is electrically coupled to ground through the capacitor C1. A second terminal of the electronic switch Q1 is electrically coupled to the serial data pin SDA of the first control chip 110. A third terminal of the electronic switch Q1 is electrically coupled to a cathode of the diode D1 through resistor R4. An anode of the diode D1 is electrically coupled to the first power source terminal P1. A parasitic diode d1 is electrically coupled between the second and third terminals of the electronic switch Q1.

A first terminal of the electronic switch Q2 is electrically coupled to the first power source terminal P1 through the resistor R5, and is electrically coupled to ground through the capacitor C2. A second terminal of the second electronic switch Q2 is electrically coupled to the serial clock pin SCL of the first control chip 110. A third terminal of the second electronic switch Q2 is electrically coupled to a cathode of the diode D2. An anode of the diode D2 is electrically coupled to the first power source terminal P1. A first terminal 1 of the first connector 112 is electrically coupled to the third terminal of the second switch Q2. A second terminal 2 of the first connector 112 is electrically coupled to ground. A third terminal 3 of the first connector 112 is electrically coupled to the third terminal of the first electronic switch Q1. A parasitic diode d2 is electrically coupled between the second and third terminals of the electronic switch Q2.

Figure 4:
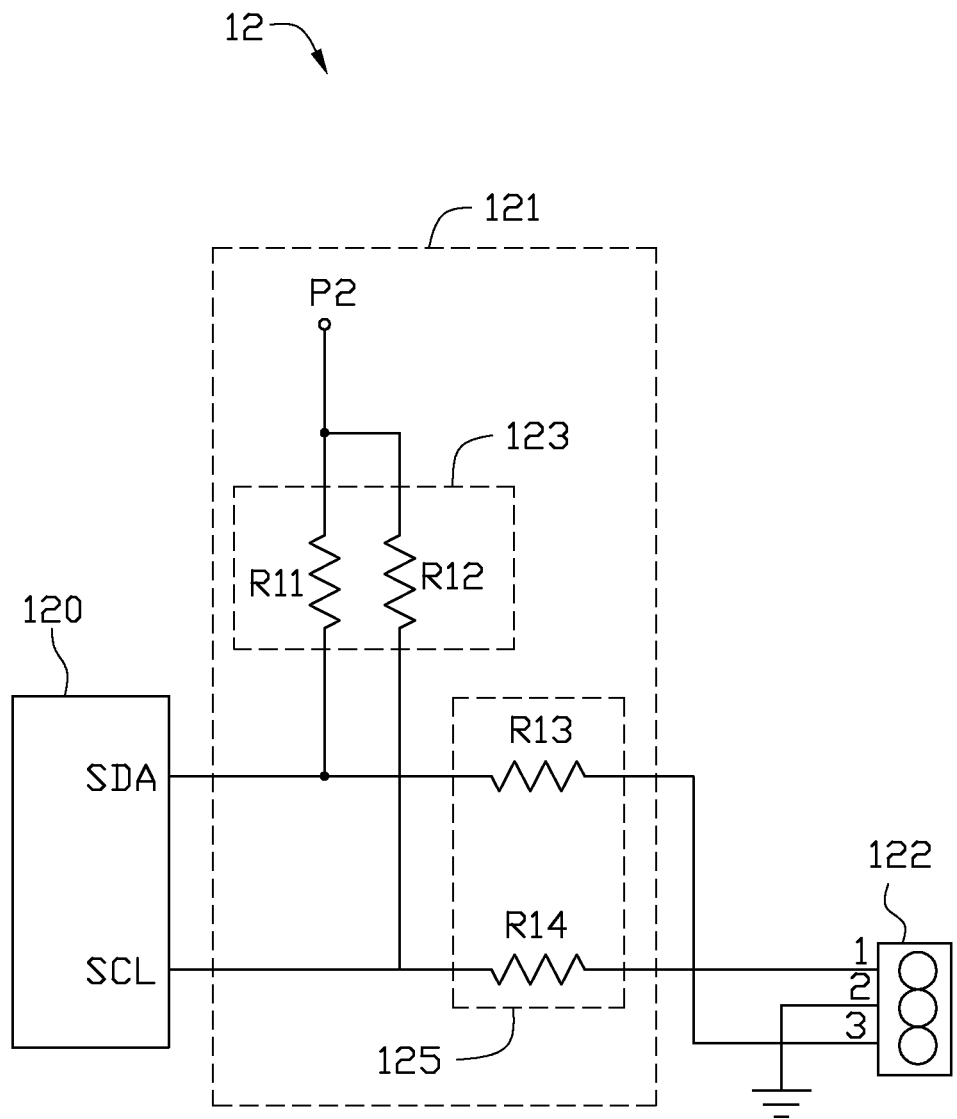
FIG. 4 is a circuit diagram of an example embodiment of the second control circuit of FIG. 2.

FIG. 4 is a circuit diagram of an example embodiment of the second control circuit 12. The second transmission unit 121 of the second control unit 12 can comprise a second voltage division unit 123 and a third voltage division unit 125. The second voltage division 123 can comprise two resistors R11 and R12. The third voltage division 125 can comprise two resistors R13 and R14. A serial data pin SDA of the second control chip 120 is electrically coupled to a second power source terminal P2 through the resistor R11, and is electrically coupled to a third terminal 3 of the second connector 122 through the resistor R13. A serial clock pin SCL of the second control chip 120 is electrically coupled to the second power source terminal P2 through the resistor R12, and is electrically coupled to a first terminal 1 of the second connector 122 through the resistor R14. A second terminal 2 of the second connector 122 is electrically coupled to ground. The first to third terminals 1-3 of the first connector 112 are electrically coupled to the first to third terminals 1-3 of the connector 122, respectively.

In at least one embodiment, the second power source terminal P2 can be a 3.3 voltage (V) power source terminal, a 5V power source terminal, a 12V power source terminal, or a 5V_SB power source terminal, to output 3.3V, 5V, 12V, or 5V correspondingly. When the second power source terminal P2 is a 3.3 V power source terminal, the resistors R11 and R12 can be omitted.

In at least one embodiment, the electronic switches Q1 and Q2 are n-channel metal oxide semiconductor field-effect transistors (NMOSFETs). The first to third terminals of each of the electronic switches Q1 and Q2 correspond to a gate, a source, and a drain. Both of the electronic switches Q1 and Q2 are open drain gates.

The serial clock pin SCL of the first control chip 110 outputs a clock pulse signal. The serial data pin SDA of the first control chip 110 outputs a pulse-width modulation (PWM) signal.

When the clock pulse signal output from the serial clock pin SCL of the first control chip 110 is a digital low level signal, a voltage of the source of the electronic switch Q2 is less than a voltage of the gate of the electronic switch Q2. The electronic switch Q2 is turned on. The drain of the electronic switch Q2 outputs the digital low level signal to the anode of the diode D2 through the resistor R6 and the first terminal of the first connector 112. The diode D2 is turned on. The first terminal 1 of the first connector 112 transmits the digital low level signal received from the third terminal of the electronic switch Q2 to the first terminal 1 of the second connector 122. The first terminal 1 of the second connector 122 outputs the digital low level signal to the serial clock pin SCL of the second control chip 120 through resistor R14. Therefore, the serial clock pin SCL of the first control chip 110 can transmit the digital low level signal to the serial clock pin SCL of the second control chip 120.

When the PWM signal output from the serial data pin SDA the first control chip 110 is digital low level signal, a voltage of the source of the electronic switch Q1 is less than a voltage of the gate of the electronic switch Q1. The electronic switch Q1 is turned on. The source of the electronic switch Q1 outputs a digital low level signal to the anode of the diode D1 and the third terminal 3 of the first connector 112. The diode D1 is turned on. The third terminal 3 of the first connector 112 transmits the digital low level signal received from the drain of the electronic switch Q1 to the third terminal 3 of the second connector 122. The third terminal 3 of the second connector 122 transmits the digital low level signal to the serial data pin SDA of the second control chip 120 through the resistor R13. Therefore, the serial data pin SDA of the first control chip 110 can transmit the digital low level signal to the serial data pin SDA of the second control chip 120. When the PWM signal output from the serial data pin SDA the first control chip 110 is digital high level signal, the electronic switch Q1 is turned off. The cathode of the diode D1 is electrically coupled to the second power source terminal P2 through the first connector 112, the second connector 122, and resistor R11. The diode D1 is turned off. The serial data pin SDA of the second control chip 120 receives the digital high level signal output from the serial data pin SDA of the first control chip 110.

When the clock pulse signal output from the serial clock pin SCL of the first control chip 110 is a digital high level signal, the electronic switch Q2 is turned off. The diode D2 is turned off. the serial clock pin SCL of the second control chip 120 receives a digital high level signal from the second power source terminal P2 through the resistor R11.

The serial clock pin SCL of the second control chip 120 outputs a clock pulse signal. The serial data pin SDA of the second control chip 120 outputs a PWM signal.

When the clock pulse signal output from the serial clock pin SCL of the second control chip 120 is a digital low level signal, the diode D2 is turned on. The electronic switch Q2 is turned on, due to the parasitic diode d2 is turned on. The serial clock pin SCL of the first control chip 110 receives the digital low level signal output from the serial clock pin SCL of the second control chip 120.

When the PWM signal output from the serial data pin SDA of the second control chip 120 is digital low level signal, the diode D1 is turned on. The electronic switch Q1 is turned on, due to the parasitic diode d1 is turned on. The serial clock pin SCL of the first control chip 110 receives the digital low level signal output from the serial clock pin SCL of the second control chip 120.

When the PWM signal output from the serial data pin SDA the second control chip 120 is digital high level signal, the diode D1 is turned off. The electronic switch Q1 is turned off. The serial data pin SDA of the first control chip 110 receives a digital high level signal from the first power source terminal P1. Therefore, when the serial data pin SDA of the second control chip 120 outputs a digital high level signal, such as logic 1, the serial data pin SDA the first control chip 110 receive a digital high level signal from the first power source terminal P1. When the clock pulse signal output from the serial clock pin SCL of the second control chip 120 is a digital high level signal, the diode D2 is turned off. The electronic switch Q2 is turned off. The serial clock pin SCL of the first control chip 110 receives a digital high level signal from the first power source terminal P1 through the resistor R2.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. An interface circuit comprising:
    a first control circuit comprising a first control chip, a first transmission unit electrically coupled to the first control chip, and a first connector electrically coupled to the first transmission unit, the first transmission unit comprising:
        a first voltage division unit electrically coupled to the first control chip and a first power source terminal, and a switch unit electrically coupled to the first control chip, the first voltage division unit, and the first connector;
    a second control circuit comprising a second control chip, a second transmission unit electrically coupled to the second control chip, and a second connector electrically coupled to the second transmission unit and the first connector, the second transmission unit comprising:

a second voltage division unit electrically coupled to the second control chip and a second power source terminal, and a third voltage division unit electrically coupled to the second control chip, the second voltage division unit, and the second connector;

wherein each of the first and second control chips comprises a serial data pin and a serial clock pin, the first and second control chips configured such that in event that the serial data pin or the serial clock pin of the first control chip outputs a first control signal, the switch unit of the first transmission unit is turned on, and the first control signal is transmitted to the serial data pin or the serial clock pin of the second control chip through the first connector, the second connector, and the third voltage division unit of the second transmission unit; and wherein the first and second control chips are configured such that in event that the serial data pin or the serial clock pin of the first control chip outputs a second control signal, the switch unit of the first transmission unit is turned off, and the serial data pin or the serial clock pin of the second control chip receives a voltage of the second power source terminal through the second voltage division unit.

2. The interface circuit of claim 1, wherein in event that the serial data pin or the serial clock pin of the second control chip outputs a third control signal, the switch unit of the first transmission unit is turned on, the first control signal is transmitted to the serial data pin or the serial clock pin of the first control chip through the third voltage division unit of the second transmission, the second connector, and the first connector; and in event that the serial data pin or the serial clock pin of the second control chip outputs a fourth control signal, the switch unit of the first transmission unit is turned off, the serial data pin or the serial clock pin of the first control chip receives a voltage of the first power source terminal through the first voltage division unit.

3. The interface circuit of claim 2, wherein in event that the serial data pin of the first control chip outputs a digital low level signal, the first electronic switch and the first diode are turned on, the serial data pin of the first control chip transmits the digital low level signal to the serial data pin of the second control chip through the first and second connectors; in event that the serial data pin of the first control chip outputs a digital high level signal, the first electronic switch and the first diode are turned off, the serial data pin of the second control chip receives the voltage of the second power source terminal through the seventh resistor; when the serial data pin of the second control chip outputs a digital low level signal, the first diode is turned on, the first electronic switch is turned on, the digital low level signal from the serial data pin of the second control chip is transmitted to the serial data pin of the first control chip through the first and second connector; when the serial data pin of the second control chip outputs a digital high level signal, the first electronic switch and the first diode are turned off, the serial data pin of the first control chip receives the voltage of the first power source terminal through the first resistor.

4. The interface circuit of claim 1, wherein the first voltage division unit of the first transmission unit comprises first and second resistors, the switch unit comprises third to sixth resistors, a first electronic switch, a second electronic switch, a first diode and a second diode; the second voltage division unit of the second transmission unit comprises seventh and eighth resistors, the third voltage division unit comprises ninth and tenth resistors, the serial data pin and the serial clock pin of the first control chip are electrically coupled to the first power source terminal respectively through the first and second resistors; a first terminal of the first electronic switch is electrically coupled to the first power source terminal, a second terminal of the first electronic switch is electrically coupled to the serial data pin of the first control chip, a third terminal of the first electronic switch is electrically coupled to a cathode of the first diode through the fourth resistor; a first terminal of the second electronic switch is electrically coupled to the first power source terminal through the fifth resistor, a second terminal of the second electronic switch is electrically coupled to the serial clock pin of the first control chip, a third terminal of the second electronic switch is electrically coupled to a cathode of the second diode through the sixth resistor, anodes of the first and second diodes are electrically coupled to the first power source terminal; a first pin of the first connector is electrically coupled to the third terminal of the second electronic switch, a second pin of the first connector is grounded, a third pin of the first connector is electrically coupled to the third terminal of the first electronic switch; the serial data pin of the second control chip is electrically coupled to the second power source terminal through the seventh resistor, and is electrically coupled to a third pin of the second connector through the eighth resistor; the serial clock pin of the second control chip is electrically coupled to the second power source terminal through the ninth resistor, and is electrically coupled to a first pin of the second connector through the tenth resistor; a second pin of the second connector is electrically coupled to ground; the first to third pins of the first connector are electrically coupled to the first to third pins of the second connector.

5. The interface circuit of claim 4, wherein the first transmission unit comprises a first capacitor and a second capacitor, the first terminal of the first electronic switch is grounded through the first capacitor, and the first terminal of the second switch is grounded through the second capacitor.

6. The interface circuit of claim 4, wherein the first and second electronic switches are n-channel metal oxide semiconductor field-effect transistors (NMOSFETs), the first to third terminals of each electronic switch correspond to a gate, a source, and a drain of the NMOSFET respectively.

7. The interface circuit of claim 1, wherein the first and second control chips are inter-integrated circuit (I2C) control chip.

8. An electronic system comprising an interface circuit, the interface circuit comprising a motherboard and a system board, the motherboard comprising:

a first control circuit comprising a first control chip, a first transmission unit electrically coupled to the first control chip, and a first connector electrically coupled to the first transmission unit, the first transmission unit comprising:
a first voltage division unit electrically coupled to the first control chip and a first power source terminal, and a switch unit electrically coupled to the first control chip, the first voltage division unit, and the first connector;

a second control circuit comprising a second control chip, a second transmission unit electrically coupled to the second control chip, and a second connector electrically coupled to the second transmission unit and the first connector, the second transmission unit comprising:
a second voltage division unit electrically coupled to the second control chip and a second power source terminal, and a third voltage division unit electrically coupled to the second control chip, the second voltage division unit, and the second connector;

wherein each of the first and second control chips comprises a serial data pin and a serial clock pin, the first and second control chips configured such that in event that the serial data pin or the serial clock pin of the first control chip outputs a first control signal, the switch unit of the first transmission unit is turned on, and the first control signal is transmitted to the serial data pin or the serial clock pin of the second control chip through the first connector, the second connector, and the third voltage division unit of the second transmission unit; and wherein the first and second control chips are configured such that in event that the serial data pin or the serial clock pin of the first control chip outputs a second control signal, the switch unit of the first transmission unit is turned off, and the serial data pin or the serial clock pin of the second control chip receives a voltage of the second power source terminal through the second voltage division unit.

9. The electronic system of claim 8, wherein in event that the serial data pin or the serial clock pin of the second control chip outputs a third control signal, the switch unit of the first transmission unit is turned on, the first control signal is transmitted to the serial data pin or the serial clock pin of the first control chip through the third voltage division unit of the second transmission, the second connector, and the first connector; and in event that the serial data pin or the serial clock pin of the second control chip outputs a fourth control signal, the switch unit of the first transmission unit is turned off, the serial data pin or the serial clock pin of the first control chip receives a voltage of the first power source terminal through the first voltage division unit.

10. The electronic system of claim 9, wherein in event that the serial data pin of the first control chip outputs a digital low level signal, the first electronic switch and the first diode are turned on, the serial data pin of the first control chip transmits the digital low level signal to the serial data pin of the second control chip through the first and second connectors; in event that the serial data pin of the first control chip outputs a digital high level signal, the first electronic switch and the first diode are turned off, the serial data pin of the second control chip receives the voltage of the second power source terminal through the seventh resistor; when the serial data pin of the second control chip outputs a digital low level signal, the first diode is turned on, the first electronic switch is turned on, the digital low level signal from the serial data pin of the second control chip is transmitted to the serial data pin of the first control chip through the first and second connector; when the serial data pin of the second control chip outputs a digital high level signal, the first electronic switch and the first diode are turned off, the serial data pin of the first control chip receives the voltage of the first power source terminal through the first resistor.

11. The electronic system of claim 10, wherein the first transmission unit comprises a first capacitor and a second capacitor, the first terminal of the first electronic switch is grounded through the first capacitor, and the first terminal of the second switch is grounded through the second capacitor.

12. The electronic system of claim 10, wherein the first and second electronic switches are n-channel metal oxide semiconductor field-effect transistors (NMOSFETs), the first to third terminals of each electronic switch correspond to a gate, a source, and a drain of the NMOSFET respectively.

13. The electronic system of claim 8, wherein the first voltage division unit of the first transmission unit comprises first and second resistors, the switch unit comprises third to sixth resistors, a first electronic switch, a second electronic switch, a first diode and a second diode; the second voltage division unit of the second transmission unit comprises seventh and eighth resistors, the third voltage division unit comprises ninth and tenth resistors, a first terminal of the first electronic switch is electrically coupled to the first power source terminal, a second terminal of the first electronic switch is electrically coupled to the serial data pin of the first control chip, a third terminal of the first electronic switch is electrically coupled to a cathode of the first diode through the fourth resistor; a first terminal of the second electronic switch is coupled to the first power source terminal through the fifth resistor, a second terminal of the second electronic switch is electrically coupled to the serial clock pin of the first control chip, a third terminal of the second electronic switch is electrically coupled to a cathode of the second diode through the sixth resistor, anodes of the first and second diodes are coupled to the first power source terminal; a first pin of the first connector is electrically coupled to the third terminal of the second electronic switch, a second pin of the first connector is grounded, a third pin of the first connector is electrically coupled to the third terminal of the first electronic switch; the serial data pin of the second control chip is electrically coupled to the second power source terminal through the seventh resistor, and is electrically coupled to a third pin of the second connector through the eighth resistor; the serial clock pin of the second control chip is electrically coupled to the second power source terminal through the ninth resistor, and is electrically coupled to a first pin of the second connector through the tenth resistor; a second pin of the second connector is grounded; the first to third pins of the first connector are electrically coupled to the first to third pins of the second connector respectively.

14. The electronic system of claim 8, wherein the first and second control chips are inter-integrated circuit (I2C) control chip.

* * * * *